(12) United States Patent
Cheng et al.

(10) Patent No.: US 10,446,519 B2
(45) Date of Patent: Oct. 15, 2019

(54) WAFER BONDING METHODS AND WAFER-BONDED STRUCTURES

(71) Applicants: Semiconductor Manufacturing International (Shanghai) Corporation, Shanghai (CN); Semiconductor Manufacturing International (Beijing) Corporation, Beijing (CN)

(72) Inventors: Jin Guang Cheng, Shanghai (CN); Lin Bo Shi, Shanghai (CN); Fu Cheng Chen, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/919,940

(22) Filed: Mar. 13, 2018

(65) Prior Publication Data
US 2018/0269178 A1 Sep. 20, 2018

(30) Foreign Application Priority Data
Mar. 16, 2017 (CN) .......................... 2017 1 0156402

(51) Int. Cl.
*H01L 23/00* (2006.01)
*H01L 25/00* (2006.01)
(Continued)

(52) U.S. Cl.
CPC .............. *H01L 24/83* (2013.01); *H01L 24/27* (2013.01); *H01L 24/29* (2013.01); *H01L 24/32* (2013.01); *H01L 25/0657* (2013.01); *H01L 25/50* (2013.01); *H01L 21/0273* (2013.01); *H01L 21/31144* (2013.01); *H01L 2224/26145* (2013.01); *H01L 2224/278* (2013.01); *H01L 2224/27011* (2013.01);
(Continued)

(58) Field of Classification Search
CPC . H01L 2224/26145; H01L 2224/83051; H01L 23/04; H01L 23/10
See application file for complete search history.

(56) References Cited

U.S. PATENT DOCUMENTS

| | | | |
|---|---|---|---|
| 2010/0176509 A1* | 7/2010 | Murai | H01L 21/563 257/737 |
| 2010/0244159 A1* | 9/2010 | Karlin | B81C 1/00269 257/415 |
| 2015/0262900 A1* | 9/2015 | Wang | H01L 23/04 257/704 |

* cited by examiner

*Primary Examiner* — Frederick B Hargrove
(74) *Attorney, Agent, or Firm* — Anova Law Group, PLLC

(57) ABSTRACT

A wafer bonding method includes providing a first wafer including a first wafer surface, forming a first metal layer on the first wafer surface, and forming a first annular retaining wall structure including a first annular retaining wall and a second annular retaining wall surrounded by the first annular retaining wall. The first metal layer is formed between the first annular retaining wall and the second annular retaining wall. The method includes providing a second wafer including a second wafer surface, forming a second metal layer on the second wafer surface, and forming a second annular retaining wall structure including a third annular retaining wall and a fourth annular retaining wall surrounded by the third annular retaining wall. The second metal layer is formed between the third annular retaining wall and the fourth annular retaining wall. The method further includes bonding the first metal layer to the second metal layer.

18 Claims, 10 Drawing Sheets

(51) Int. Cl.
*H01L 25/065* (2006.01)
*H01L 21/027* (2006.01)
*H01L 21/311* (2006.01)

(52) U.S. Cl.
CPC ......... *H01L 2224/2762* (2013.01); *H01L 2224/29117* (2013.01); *H01L 2224/29124* (2013.01); *H01L 2224/29144* (2013.01); *H01L 2224/29147* (2013.01); *H01L 2224/32013* (2013.01); *H01L 2224/32014* (2013.01); *H01L 2224/32145* (2013.01); *H01L 2224/83007* (2013.01); *H01L 2224/83895* (2013.01); *H01L 2225/06565* (2013.01); *H01L 2924/01032* (2013.01); *H01L 2924/059* (2013.01); *H01L 2924/05042* (2013.01); *H01L 2924/05442* (2013.01); *H01L 2924/20105* (2013.01); *H01L 2924/20106* (2013.01)

WAFER BONDING METHODS AND WAFER-BONDED STRUCTURES

CROSS-REFERENCES TO RELATED APPLICATIONS

This application claims the priority of Chinese Patent Application No. CN201710156402.4, filed on Mar. 16, 2017, the entire content of which is incorporated herein by reference.

FIELD OF THE DISCLOSURE

The present disclosure generally relates to the field of semiconductor technology and, more particularly, relates to wafer bonding methods and wafer-bonded structures.

BACKGROUND

Packaging of chips may prevent degradation of the electrical performance of chip circuits caused by impurities in the air. Moreover, the packaged chips are also convenient for transportation and installation. The packaging quality may directly affect the performance of the chip and also affect the design and the manufacturing of the printed circuit board connected to the chip.

The current packaging technology has been gradually transitioned from surface-mounting technology and ball grid array (BGA) terminal package technology to three-dimensional (3D) packaging technology. The 3D packaging technology may be categorized into different types, such as package-stacked-type 3D packaging technology, chip-stacked-type 3D packaging technology, wafer-stacked-type 3D packaging technology, etc. The 3D packaging technology demonstrates a number of advantages including the ability to improve the density of interconnections and the ability to reduce the overall height of the final device.

However, there is still a need to improve the packaging technology to provide desirable wafer-bonding to meet requirements of the development in semiconductor technology. The disclosed wafer bonding methods and wafer-bonded structures are directed to solve one or more problems set forth above and other problems in the art.

BRIEF SUMMARY OF THE DISCLOSURE

One aspect of the present disclosure provides a wafer bonding method. The method includes providing a first wafer including a first wafer surface, forming a first metal layer on a portion of the first wafer surface, and forming a first annular retaining wall structure including a first annular retaining wall and a second annular retaining wall on the first wafer surface. The first annular retaining wall and the second annular retaining wall are separated from each other, the second annular retaining wall is formed on the first wafer surface surrounded by the first annular retaining wall, and the first metal layer is formed on the first wafer surface between the first annular retaining wall and the second annular retaining wall. The method also includes providing a second wafer including a second wafer surface, forming a second metal layer on a portion of the second wafer surface, and forming a second annular retaining wall structure including a third annular retaining wall and a fourth annular retaining wall on the second wafer surface. The third annular retaining wall and the fourth annular retaining wall are separated from each other, the fourth annular retaining wall is formed on the second wafer surface surrounded by the third annular retaining wall, and the second metal layer is formed on the second wafer surface between the third annular retaining wall and the fourth annular retaining wall. The method further includes bonding the first metal layer and the second metal layer together.

Another aspect of the present disclosure provides a wafer-bonded structure. The wafer-bonded structure includes a first wafer including a first wafer surface, a first metal layer formed on a portion of the first wafer surface, and a first annular retaining wall structure formed on the first wafer surface and including a first annular retaining wall and a second annular retaining wall. The first annular retaining wall and the second annular retaining wall are separated from each other, the second annular retaining wall is formed on the first wafer surface surrounded by the first annular retaining wall, and the first metal layer is formed on the first wafer surface between the first annular retaining wall and the second annular retaining wall. The wafer-bonded structure also includes a second wafer including a second wafer surface, a second metal layer formed on a portion of the second wafer surface, and a second annular retaining wall structure formed on the second wafer surface and including a third annular retaining wall and a fourth annular retaining wall. The third annular retaining wall and the fourth annular retaining wall are separated from each other, the fourth annular retaining wall is formed on the second wafer surface surrounded by the third annular retaining wall, the second metal layer is formed on the second wafer surface between the third annular retaining wall and the fourth annular retaining wall, and the first metal layer and the second metal layer are bonded together.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
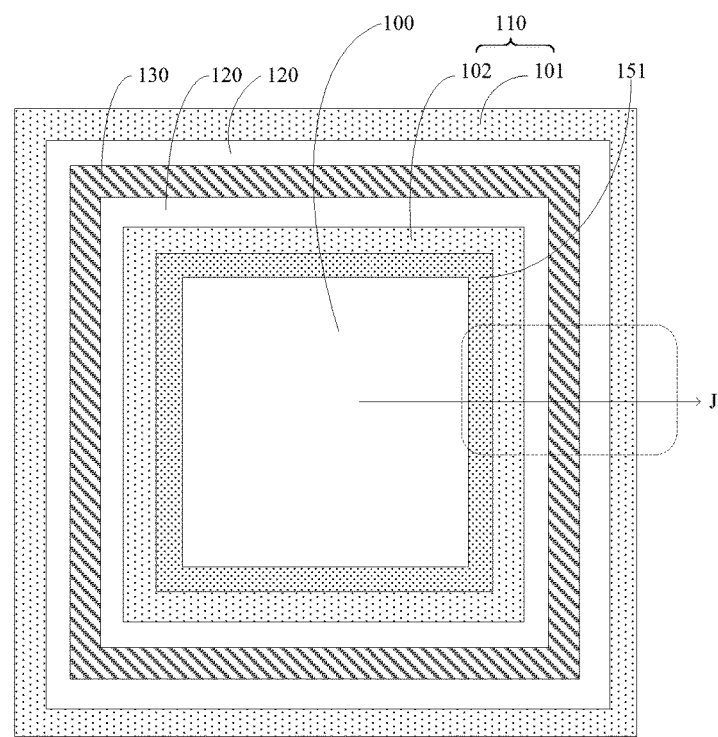
FIG. 1 illustrates a schematic perspective top view of a wafer-bonded structure.
Figure 2:
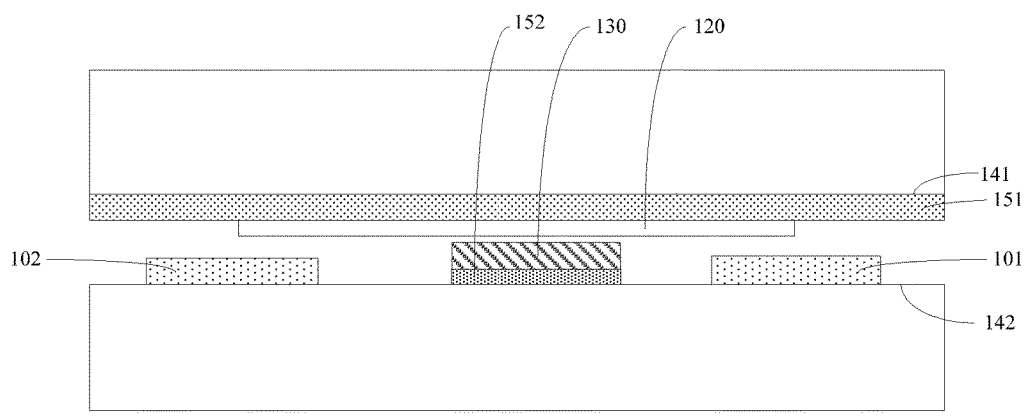
FIG. 2 illustrates a schematic partial cross-section view of the structure shown in FIG. 1 along a J direction.

FIGS. 1-2 show schematic views of a wafer-bonded structure. Specifically, FIG. 1 shows a perspective top view of the wafer-bonded structure, and FIG. 2 shows a schematic partial cross-section view of the structure shown in FIG. 1 along a J direction.

Referring to FIGS. 1-2, the wafer-bonded structure includes a first wafer having a first wafer surface 141, a first metal layer 120 formed on a portion of the first wafer surface 141, a second wafer having a second wafer surface 142, a second metal layer 130 formed on a portion of the second wafer surface 142, an annular retaining wall structure 110 formed on the second wafer surface 142. The annular retaining wall structure 110 includes a first annular retaining wall 101 and a second annular retaining wall 102 separated from the first annular retaining wall 101. The second annular retaining wall 102 is formed on the portion of the second wafer surface 142 surrounded by the first annular retaining wall 101. The second metal layer 130 is formed on the portion of the second wafer surface 142 between the first annular retaining wall 101 and the second annular retaining wall 102. The first metal layer 120 and the second metal layer 130 are bonded together, and the first metal layer 120 covers the second metal layer 130. That is, during the process for bonding the first wafer and the second wafer, the entire top surface of the second metal layer 130 is pressed onto the first metal layer 120 to achieve the bonding between the first metal layer 120 and the second metal layer 130. The wafer-bonded structure also includes a device region 100 surrounded by the second annular retaining wall 102, and a plurality of devices formed in the device region 100.

Further, the first wafer also includes a first dielectric layer 151 formed on the first wafer surface 141, and accordingly, the first metal layer 120 is formed on the first dielectric layer 151. Moreover, the second wafer also includes a second dielectric layer 152 formed on the second wafer surface 142, and accordingly, the second metal layer 130 is formed on the second dielectric layer 152.

The wafer-bonding result according to the wafer-bonded structure described above may still need to be improved. The undesired wafer-bonding result of the wafer-bonded structure may be caused by the following reasons. During the process for bonding the first metal layer 120 and the second metal layer 130, because the annular retaining wall structure 110 only includes a single ring, the alloy formed by bonding the first metal layer 120 and the second metal layer 130 may easily overflow. Specifically, during the bonding process, the first metal layer 120 and the second metal layer 130 may generate an alloy in a molten state with high flowability. In the meantime, because the annular retaining wall structure 110 on the second wafer surface 142 only includes a single ring, the alloy in the molten state may easily overflow through the gap between the annular retaining wall structure 110 and the first wafer surface 141.

Further, because the alloy generated by the first metal layer 120 and the second metal layer 130 during the bonding process is in the molten state, the flowability of the alloy is high. Therefore, the first metal layer 120 may be shifted by a relatively large distance with respect to the second metal layer 130 during the bonding process. In order to ensure the bonding between the first metal layer 120 and the second metal layer 130, the size of the first metal layer 120 is usually designed to be sufficiently large to cover the second metal layer 130 even when such a large shift occurs during the bonding process. That is, the width and the position of the first metal layer 120 are designed to ensure that the entire top surface of the second metal layer 130 will be pressed onto the top surface of the first metal layer 120 during the bonding process. For example, along a direction parallel to the first wafer surface 141, the width of the first metal layer 120 is about 15 μm to 30 μm larger than the width of the second metal layer 130. Therefore, in the wafer-bonded structure, the first metal layer 120 may be in contact with the annular retaining wall structure 110, and thus the alloy in the molten state may more easily overflow through a channel along the first metal layer 120. As such, the wafer-bonding result may be undesired.

Figure 24:
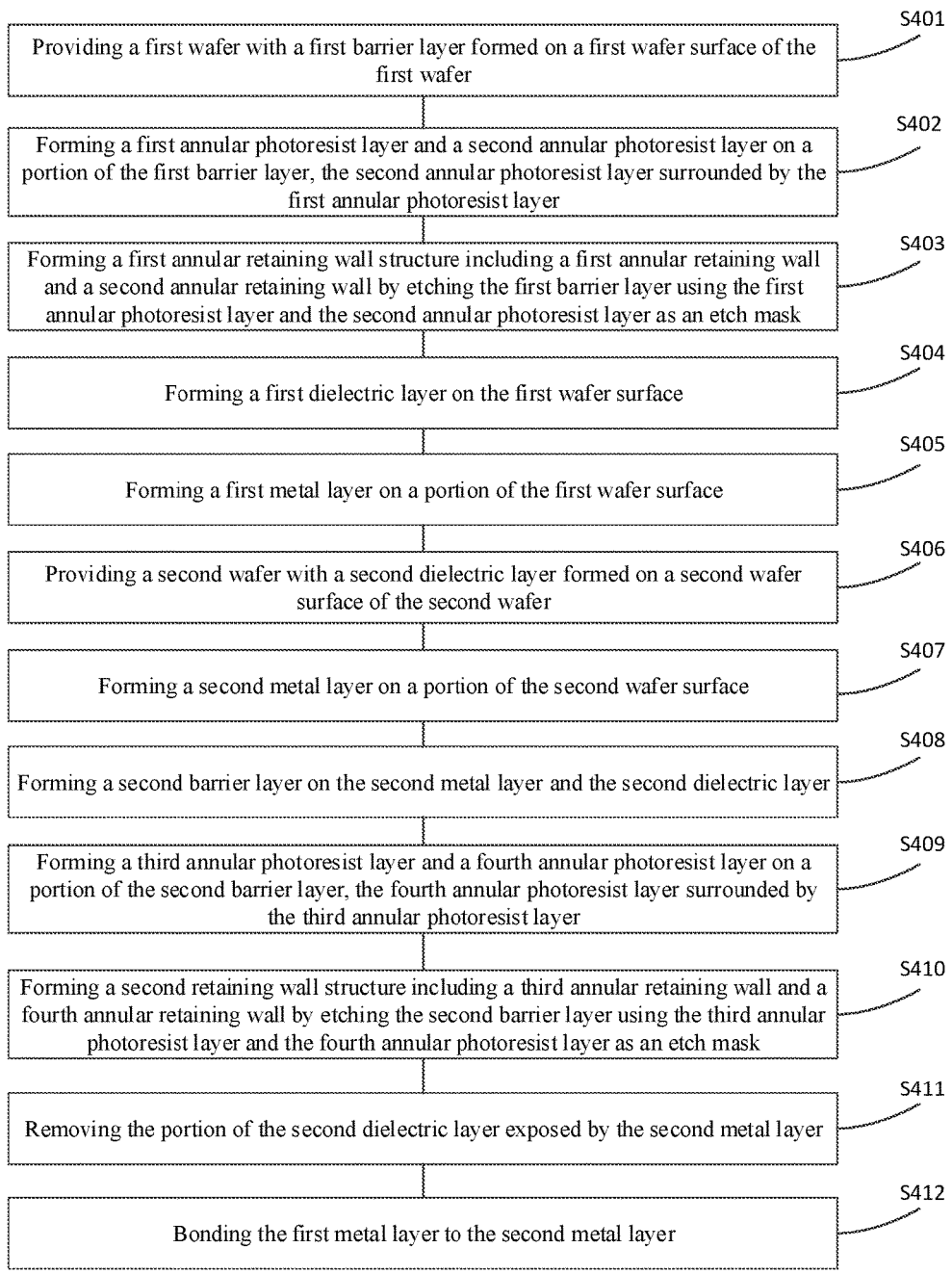
FIG. 24 illustrates a flowchart of an exemplary wafer bonding method consistent with various embodiments of the present disclosure.

The present disclosure provides a wafer bonding method to form a wafer-bonded structure. FIG. 24 illustrates a flowchart of an exemplary wafer bonding method consistent with various embodiments of the present disclosure. FIGS. 3-20 illustrate schematic views of structures at certain stages of the exemplary wafer bonding method.

Figure 3:
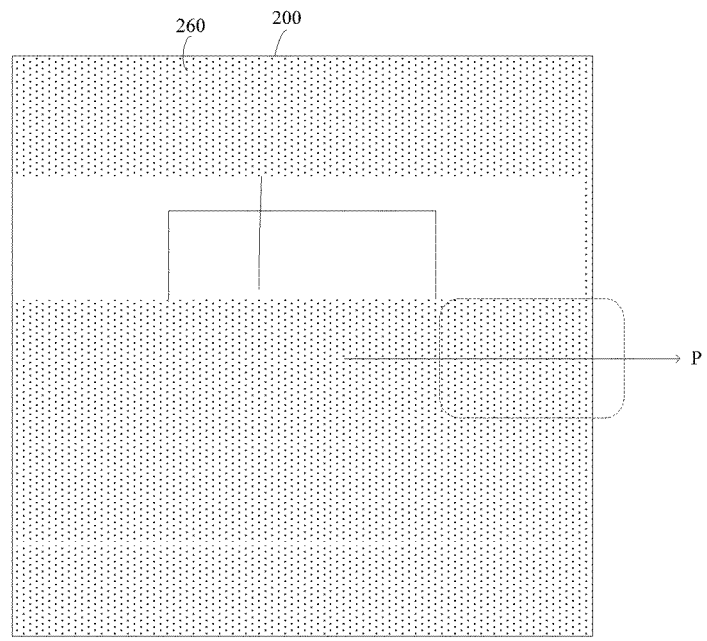
FIGS. 3-20 illustrate schematic views of structures at certain stages of an exemplary wafer bonding method consistent with various embodiments of the present disclosure.
Figure 4:
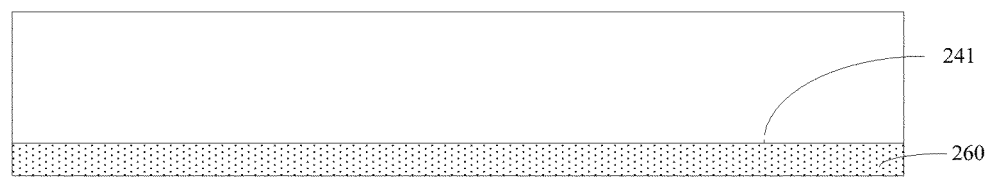

Referring to FIG. 24, at the beginning of the wafer bonding process, a first wafer with a first barrier layer formed on a first wafer surface of the first wafer may be provided (S401). FIGS. 3-4 show schematic views of a semiconductor structure consistent with various embodiments of the present disclosure. Specifically, FIG. 3 shows a schematic perspective top view of the first wafer, and FIG. 4 shows a schematic partial cross-section view of the structure shown in FIG. 3 along a P direction.

Referring to FIGS. 3-4, a first wafer (not labeled) is provided. The first wafer may have a first wafer surface 241. A first barrier layer 260 may be formed on the first wafer surface 241.

The first wafer may also include a first device region 200. A plurality of first devices may be formed on the first wafer surface 241 in the first device region 200. The first barrier layer 260 may provide a process basis for a subsequently-formed first annular retaining wall structure. In one embodiment, a first annular retaining wall structure may be subsequently formed from the first barrier layer 260 to surround the first device region 200.

The first barrier layer 260 may be made of one or more of $SiO_x$, $SiN_x$, and SiON. In one embodiment, the first barrier layer 260 is made of $SiO_x$.

Figure 5:
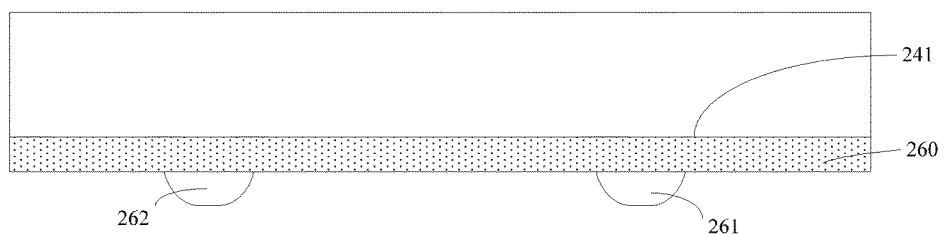

Further, returning to FIG. 24, a first annular photoresist layer may be formed on the a portion of the first barrier layer, and a second annular photoresist layer may be formed on the portion of the first barrier layer surrounded by the first annular photoresist layer (S402). FIG. 5 shows a schematic partial cross-section view of a semiconductor structure developed from the structure shown in FIG. 4.

Referring to FIG. 5, a first annular photoresist layer 261 may be formed on the a portion of the first barrier layer 260, and a second annular photoresist layer 262 may be formed on the portion of the first barrier layer 260 surrounded by the first annular photoresist layer 261. Moreover, the first annular photoresist layer 261 and the second annular photoresist layer 262 may be separated from each other.

The first annular photoresist layer 261 and the second annular photoresist layer 262 may serve as a mask during a subsequent process for forming a first annular retaining wall and a second annular retaining wall. Therefore, the first annular retaining wall and the second annular retaining wall may be formed by patterning the first barrier layer 260 using the first annular photoresist layer 261 and the second annular photoresist layer 262 as a mask.

The first annular photoresist layer 261 and the second annular photoresist layer 262 may be formed by a process including the following steps. First, a photoresist film may be formed on the first barrier layer 260. Further, an exposure and development process may be performed on the photoresist film to form the first annular photoresist layer 261 and the second annular photoresist layer 262 on a portion of the first barrier layer 260.

In one embodiment, after forming the first annular photoresist layer 261 and the second annular photoresist layer 262, and prior to forming a first annular retaining wall and the second annular retaining wall, the fabrication process may also include performing a first reflux process on the first annular photoresist layer 261 and the second annular photoresist layer 262.

In one embodiment, by controlling the process temperature and the process time of the first reflux process, each of the sidewall surfaces of the first annular photoresist layer 261 and the second annular photoresist layer 262 may have a moderate slope with respect to the surface of the first barrier layer 260. That is, the sidewall surfaces of the first annular photoresist layer 261 and the second annular photoresist layer 262 may not be perpendicular to the surface of the first barrier layer 260. As such, in a subsequent process, a first annular retaining wall with moderate-slope sidewalls and a second annular retaining wall with moderate-slope sidewalls may be formed. Because the first annular retaining wall and the second annular retaining wall together form a first annular retaining wall structure, the sidewalls of the formed first annular retaining wall structure may have moderate slopes with respect to the surface of the first barrier layer 260.

The process temperature in the first reflux process may not be too high or too low. When the process temperature is too high or too low, the first annular photoresist layer 261 and the second annular photoresist layer 262 may not have desired moderate-slope sidewalls. In one embodiment, the process parameters used in the first reflux process may include a process temperature in a range of approximately 150° C. to 200° C. and a process time in a range of approximately 2 minutes to 10 minutes.

Figure 6:
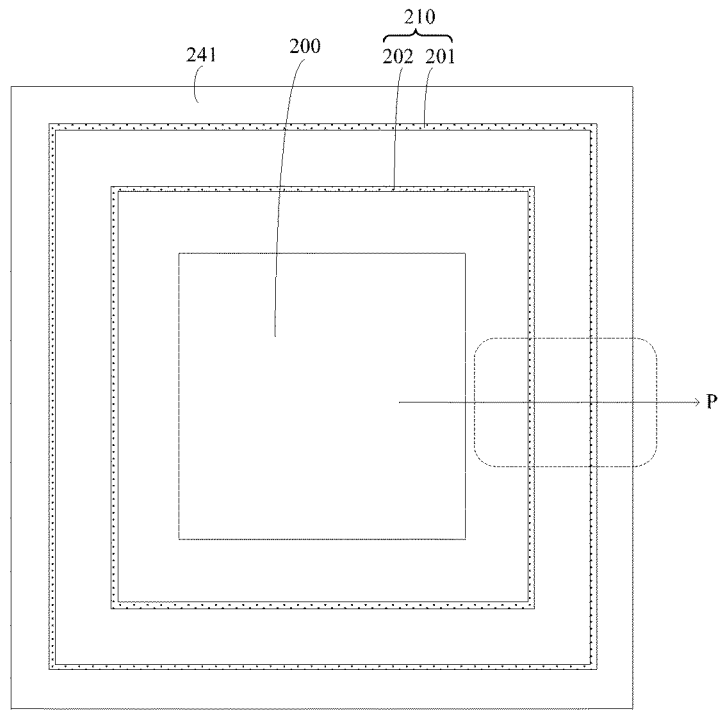
Figure 7:
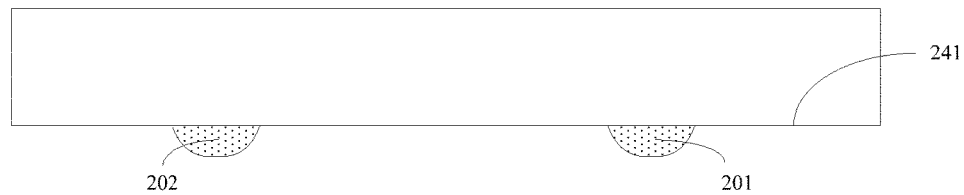

Further, returning to FIG. 24, a first annular retaining wall structure including a first annular retaining wall and a second annular retaining wall may be formed by etching the first barrier layer using the first annular photoresist layer and the second annular photoresist layer as an etch mask (S403). FIGS. 6-7 show schematic views of a semiconductor structure consistent with various embodiments of the present disclosure. Specifically, FIG. 6 shows a schematic perspective top view of the semiconductor structure, and FIG. 7 shows a partial cross-section view of the structure shown in FIG. 6 along a P direction.

Referring to FIGS. 6-7, a first annular retaining wall 201 may be formed by etching the first barrier layer 260 (referring to FIG. 4) using the first annular photoresist layer 261 (referring to FIG. 5) as an etch mask. Moreover, a second annular retaining wall 202 may be formed by etching the first barrier layer 260 using the second annular photoresist layer 262 (referring to FIG. 5) as an etch mask.

In one embodiment, the first annular retaining wall 201 and the second annular retaining wall 202 may have a squared-ring like top-view profile. In other embodiments, the first annular retaining wall 201 and the second annular retaining wall 202 may have a circular-ring like top-view profile or an elliptical-ring like top-view profile.

The first annular retaining wall 201 and the second annular retaining wall 202 may together form an annular retaining wall structure 210. The first circular retaining wall 201 and the second circular retaining wall 202 may be separated from each other, and the second annular retaining wall 202 may be formed on the portion of the first wafer surface 241 surrounded by the first annular retaining wall 201.

In one embodiment, the first device region 200 may be formed in a region surrounded by the second annular retaining wall 202. Moreover, a plurality of first devices may be formed on the portion of the first wafer surface 241 in the first device region 200.

The first annular retaining wall structure 210, together with a second annular retaining wall structure formed in a subsequent process, may provide desired ability to prevent overflow during the wafer bonding process. The first annular retaining wall structure 210 may be made of one or more of $SiO_x$, $SiN_x$, SiON, etc. In one embodiment, the first annular retaining wall structure 210 is made of $SiO_x$.

Along the direction perpendicular to the first wafer surface 241, the thickness of the first annular retaining wall structure 210 may not be too large or too small. When the thickness of the first annular retaining wall structure 210 is too large, the first metal layer and the second metal layer may not be bonded together in a subsequent process. In addition, an overly large thickness of the first annular retaining wall structure may also cause material waste. However, when the thickness of the first annular retaining wall structure 210 is too small, during the subsequent process for bonding the first metal layer and the second metal layer, the first annular retaining wall structure 210 may not be able to contact the second wafer surface, causing that the first annular retaining wall structure 210 may not have desired ability to prevent overflow of the alloy. In one embodiment, along the direction perpendicular to the first wafer surface 241, the thickness of the first annular retaining wall structure 210 may be in a range of approximately 0.6 μm to 2.5 μm.

Moreover, the profile of the first annular retaining wall structure 210 may also affect the ability of the first annular retaining wall structure 210 in preventing overflow of the alloy. In one embodiment, prior to bonding the wafers, each sidewall of the first annular retaining wall structure 210 may have a moderate slope with respect to the first wafer surface 241. That is, along the direction perpendicular to the first wafer surface 241 and from the first wafer to the first annular retaining wall structure 210, the width of the first annular retaining wall structure 210 in a direction parallel to the first wafer surface 241 may gradually decrease. Because in a subsequent process, the first annular retaining wall structure 210 with moderate-slope sidewalls may more easily become to contact the second wafer surface, the first annular retaining wall structure 210 may have desired ability to prevent overflow of the alloy. In other embodiments, prior to bonding wafers, the sidewalls of the first annular retaining wall structure may be formed perpendicular to the first wafer surface. That is, along the direction perpendicular to the first wafer surface and from the first wafer to the first annular retaining wall structure, the width of the first annular retaining wall structure in the direction parallel to the first wafer surface may remain unchanged.

In one embodiment, after forming the first annular retaining wall 201 and the second annular retaining wall 202, the formation method may also include removing the first photoresist layer 261 and the second photoresist layer 262.

Figure 8:
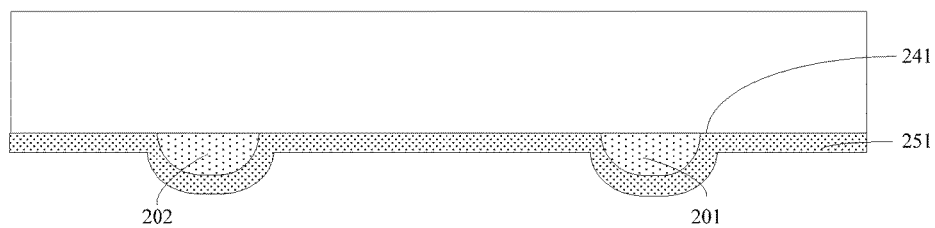

Further, referring to FIG. 24, a first dielectric layer may be formed on the first wafer surface (S404). FIG. 8 shows a schematic partial cross-section view of a semiconductor structure consistent with various embodiments of the present disclosure.

Referring to FIG. 8, a first dielectric layer 251 may be formed on the first wafer surface 241. The first dielectric layer 251 may be able to isolate the first wafer surface 241 from the subsequently-formed first metal layer. In the meantime, the first dielectric layer 251 may also improve the adhesion between the subsequently-formed first metal layer and the first wafer surface 241. In one embodiment, the first metal layer is formed after forming the first annular retaining wall structure 210 and the first dielectric layer 251. The first dielectric layer 251 formed on the first wafer surface 241 may cover the first annular retaining wall structure 210.

In one embodiment, the total thickness of the first dielectric layer 251 and the first metal layer may not be too small. When the total thickness of the first dielectric layer 251 and the first metal layer is too small, in a subsequent process, bonding the first metal layer formed on the first dielectric layer 251 to a subsequently-formed second metal layer may be more difficult.

The material used to form the first dielectric layer 251 may be an isolation material. Specifically, the first dielectric layer 251 may be formed by one or more of $SiO_x$, $SiN_x$, SiON, and SiCN. In one embodiment, the first dielectric layer 251 is made of $SiO_x$.

Figure 9:
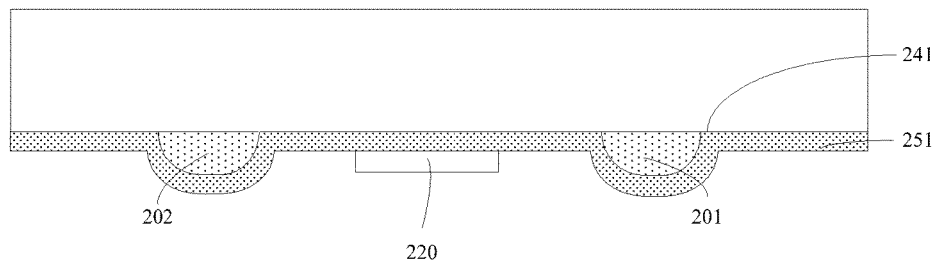

Returning to FIG. 24, a first metal layer may be formed on a portion of the first wafer surface (S405). FIG. 9 shows a schematic partial cross-section view of a semiconductor structure consistent with various embodiments of the present disclosure.

Referring to FIG. 9, a first metal layer 220 may be formed on a portion of the first wafer surface 241. In one embodiment, a first dielectric layer 251 is also formed on the first wafer surface 241, accordingly, the first metal layer 220 may be formed on a portion of the first dielectric layer 251. Moreover, the first metal layer 220 may be used to bond the subsequently-formed second metal layer.

In one embodiment, the first metal layer 220 may have an annular structure. In other embodiments, the first metal layer may have a structure other than an annular structure.

In one embodiment, the first metal layer 220 may be formed by a process including the following steps. A first metal film may be formed on the first dielectric layer 251. Then, the first metal film may be patterned to form the first metal layer 220.

The first metal layer 220 may be made of a material that can form eutectic bonding with the subsequently-formed second metal layer. For example, the first metal layer 220 may be made of one or more of Al, Au, Cu, and Ge. In one embodiment, the first metal layer 220 is made of Ge.

Along a direction parallel to the first wafer surface 241, the width of the first metal layer 220 may not be too large or too small. When the width of the first metal layer 220 is too large, the risk of the alloy formed in a subsequent bonding process to overflow through the channel along the first metal layer 220 may be increased. In addition, an overly large width of the first metal layer 220 may also cause material waste. When the width of the first metal layer 220 is too small, during the bonding process, it may be more difficult to precisely align the first metal layer 220 and the second metal layer. In one embodiment, along a direction parallel to the first wafer surface 241, the width of the first metal layer 220 is in a range of approximately 20 µm to 120 µm.

In one embodiment, after forming the first metal layer 220, the portion of the first dielectric layer 251 exposed by the first metal layer 220 may be retained. In other embodiment, after forming the first metal layer, the formation method may include removing the portion of the first dielectric layer exposed by the first metal layer.

Figure 10:
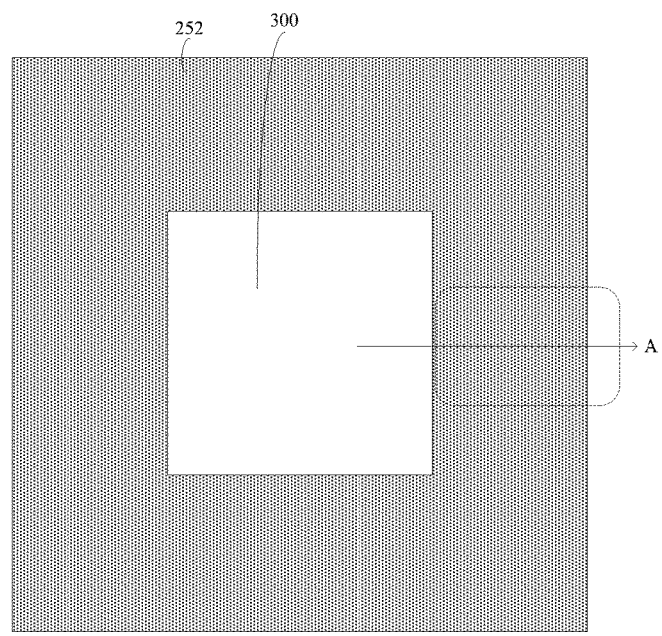
Figure 11:

Further, returning to FIG. 24, a second wafer with a second dielectric layer formed on a second wafer surface may be provided (S406). FIGS. 10-11 show schematic views of a semiconductor structure consistent with various embodiments of the present disclosure. Specifically, FIG. 10 shows a schematic perspective top view of the second wafer, and FIG. 11 shows a schematic partial cross-section view of the structure shown in FIG. 10 along an A direction. The second wafer may also include a second device region 300. For illustration purpose, the portion of the second dielectric layer formed in the second device region 300 is not shown in FIG. 10.

Referring to FIGS. 10-11, a second wafer (not labeled) is provided. The second wafer may have a second wafer surface 242. A second dielectric layer 252 may be formed on the second wafer surface 242.

In a subsequent process, a fourth annular retaining wall may be formed to surround the second device region 300. A plurality of second devices may be formed in the second device region 300 on the second wafer surface 242. The second wafer surface 242 may provide a process basis for subsequent fabrication steps.

The second dielectric layer 252 may be used to isolate the second wafer surface 242 from a subsequently-formed second metal layer. In the meantime, the second dielectric layer 252 may also improve the adhesion between the second metal layer and the second wafer surface 242.

In one embodiment, the total thickness of the second dielectric layer 252 and the second metal layer may not be too small. When the total thickness of the second dielectric layer 252 and the second metal layer is too small, in a subsequent process, bonding the second metal layer formed on the second dielectric layer 252 to the first metal layer 220 (referring to FIG. 9) may be more difficult.

The material used to form the second dielectric layer 252 may be an isolation material. Specifically, the second dielectric layer 252 may be formed by one or more of $SiO_x$, $SiN_x$, SiON, and SiCN. In one embodiment, the second dielectric layer 252 is made of $SiO_x$.

Figure 12:
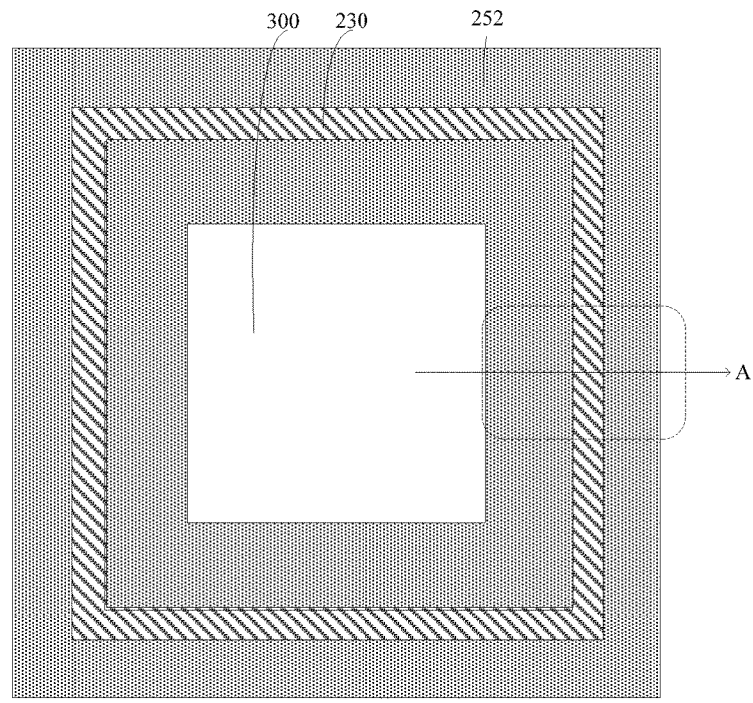
Figure 13:
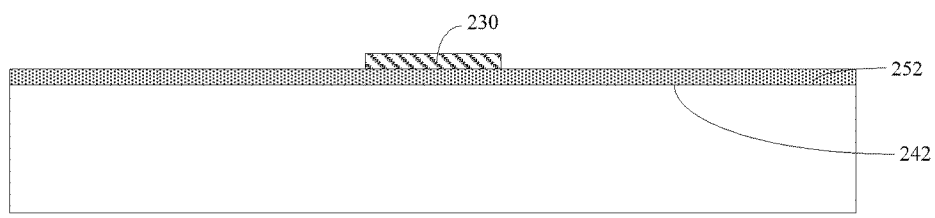

Returning to FIG. 24, a second metal layer may be formed on a portion of the second wafer surface (S407). FIGS. 12-13 show schematic views of a semiconductor structure consistent with various embodiments of the present disclosure. Specifically, FIG. 12 shows a schematic perspective top view of the semiconductor structure and FIG. 13 shows a schematic partial cross-section view of the structure shown in FIG. 12 along an A direction. For illustration purpose, the portion of the second dielectric layer formed in the second device region 300 is not shown in FIG. 12.

Referring to FIGS. 12-13, a second metal layer 230 may be formed on a portion of the second wafer surface 242. In one embodiment, a second dielectric layer 252 is formed on the second wafer surface 242, and accordingly, the second metal layer 230 may be formed on a portion of the second dielectric layer 252. Moreover, the second metal layer 230 may be used to bond the first metal layer 220.

In one embodiment, the second metal layer 230 may have an annular structure. In other embodiments, the second metal layer may have a structure other than an annular structure.

In one embodiment, the second metal layer 230 may be formed by a process including the following steps. A second metal film may be formed on the second dielectric layer 252. Then, the second metal film may be patterned to form the second metal layer 230.

The second metal layer 230 may be made of a material that can form eutectic bonding with the first metal layer 220. For example, the second metal layer 230 may be made of one or more of Al, Au, Cu, and Ge. In one embodiment, the second metal layer 230 is made of Al.

Along a direction parallel to the second wafer surface 242, the width of the second metal layer 230 may not be too large or too small. Detailed description of the requirements of the width of the second metal layer 230 may be referred to the corresponding discussion on the width of the first metal layer 220. In one embodiment, along a direction parallel to the second wafer surface 242, the width of the second metal layer 230 is in a range of approximately 20 μm to 120 μm.

Figure 14:
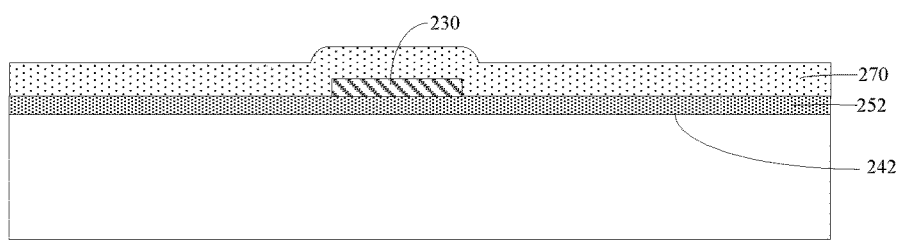

Further, returning to FIG. 24, a second barrier layer may be formed on the second metal layer and the second dielectric layer (S408). FIG. 14 shows a schematic partial cross-section view of a corresponding structure developed from the structure shown in FIG. 13.

Referring to FIG. 13, a second barrier layer 270 may be formed on the second metal layer 230 and the second dielectric layer 252. The second barrier layer 270 may provide a process basis for a subsequently-formed second annular retaining wall structure.

The second barrier layer 270 may be made of one or more of $SiO_x$, $SiN_x$, and SiON. In one embodiment, the second barrier layer 270 is made of $SiO_x$.

Figure 15:
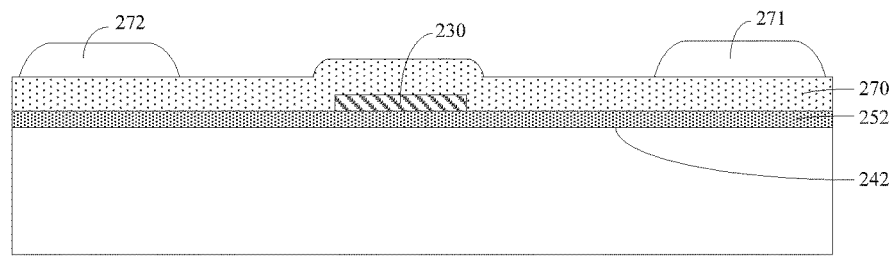

Further, returning to FIG. 24, a third annular photoresist layer may be formed on the a portion of the second barrier layer, and a fourth annular photoresist layer may be formed on the portion of the second barrier layer surrounded by the third annular photoresist layer (S409). FIG. 15 shows a schematic partial cross-section view of a semiconductor structure developed from the structure shown in FIG. 14.

Referring to FIG. 15, a third annular photoresist layer 271 may be formed on the a portion of the second barrier layer 270, and a fourth annular photoresist layer 272 may be formed on the portion of the second barrier layer 270 surrounded by the third annular photoresist layer 271. Moreover, the third annular photoresist layer 271 and the fourth annular photoresist layer 272 may be separated from each other.

The third annular photoresist layer 271 and the fourth annular photoresist layer 272 may serve as a mask in a subsequent process for forming a third annular retaining wall and a fourth annular retaining wall. Therefore, the third annular retaining wall and the fourth annular retaining wall may be formed by patterning the second barrier layer 270 using the third annular photoresist layer 271 and the fourth annular photoresist layer 262.

The third annular photoresist layer 271 and the fourth annular photoresist layer 272 may be formed by a process including the following steps. First, a photoresist film may be formed on the second barrier layer 270. Further, an exposure and development process may be performed on the photoresist film to form the third annular photoresist layer 271 and the fourth annular photoresist layer 272 on a portion of the second barrier layer 270.

In one embodiment, after forming the third annular photoresist layer 271 and the fourth annular photoresist layer 272, and prior to forming a third annular retaining wall and the fourth annular retaining wall in a subsequent process, the fabrication process may also include performing a second reflux process on the third annular photoresist layer 271 and the fourth annular photoresist layer 272.

In one embodiment, by controlling the process temperature and the process time of the second reflux process, each of the formed sidewall surfaces of the third annular photoresist layer 271 and the fourth annular photoresist layer 272 may have a moderate slope with respect to the second barrier layer 270. As such, in a subsequent process, a third annular retaining wall and a fourth annular retaining wall with moderate-slope sidewalls may be formed. Because the third annular retaining wall and the fourth annular retaining wall together form a second annular retaining wall structure. Therefore, the second annular retaining wall structure with moderate-slope sidewalls may be formed.

The process temperature in the second reflux process may not be too high or too low. When the process temperature is too high or too low, the third annular photoresist layer 271 and the fourth annular photoresist layer 272 may not have desired moderate-slope sidewalls. In one embodiment, the process parameters used in the second reflux process may include a process temperature in a range of approximately 150° C. to 200° C. and a process time in a range of approximately 2 minutes to 10 minutes.

Figure 16:
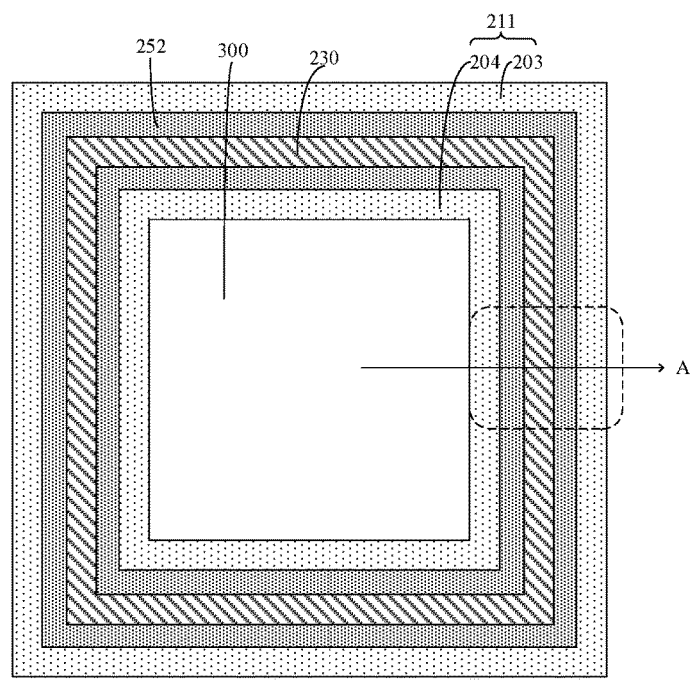
Figure 17:
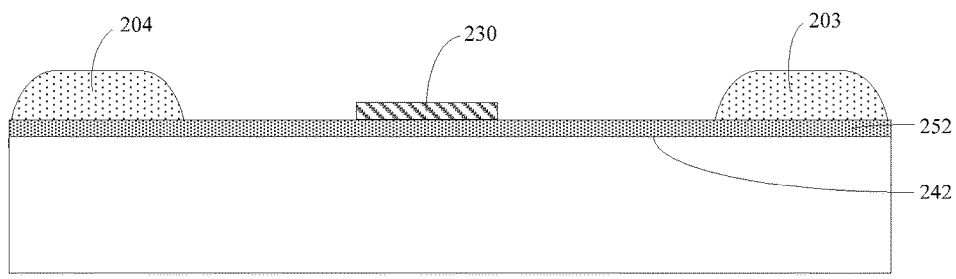

Further, returning to FIG. 24, a second annular retaining wall structure including a third annular retaining wall and a fourth annular retaining wall may be formed by etching the second barrier layer using the third annular photoresist layer and the fourth annular photoresist layer as an etch mask (S410). FIGS. 16-17 show schematic views of a semiconductor structure consistent with various embodiments of the present disclosure. Specifically, FIG. 16 shows a schematic perspective top view of the semiconductor structure, and FIG. 17 shows a partial cross-section view of the structure shown in FIG. 16 along an A direction.

Referring to FIGS. 16-17, a third annular retaining wall 203 may be formed by etching the second barrier layer 270 (referring to FIG. 14) using the third annular photoresist layer 271 (referring to FIG. 15) as an etch mask. Moreover, a fourth annular retaining wall 204 may be formed by etching the second barrier layer 270 using the fourth annular photoresist layer 272 (referring to FIG. 15) as an etch mask.

In one embodiment, the third annular retaining wall 203 and the fourth annular retaining wall 204 may have a squared-ring like top-view profile. In other embodiments, the third annular retaining wall 203 and the fourth annular retaining wall 204 may have a circular-ring like top-view profile or an elliptical-ring like top-view profile.

The third annular retaining wall 203 and the fourth annular retaining wall 204 may together form a second annular retaining wall structure 211. The third circular retaining wall 203 and the fourth circular retaining wall 204 may be separated from each other, and the fourth annular retaining wall 204 may be formed on the portion of the second wafer surface 242 surrounded by the third annular retaining wall 203.

In one embodiment, the second device region 300 may be formed in a region surrounded by the fourth annular retaining wall 204. Moreover, a plurality of second devices may be formed on the portion of the first wafer surface 241 in the second device region 300.

The second annular retaining wall structure 211, together with the first annular retaining wall structure 210, may provide desired ability to prevent overflow during the wafer bonding process. Specifically, in one embodiment, the first annular retaining wall structure 210 includes a first annular retaining wall 201 and a second annular retaining wall 202, and the second annular retaining wall structure 211 includes a third annular retaining wall 203 and a second annular retaining wall 204. Moreover, the first annular retaining wall 201 and the second annular retaining wall 202 are separated from each other and a first metal layer 220 is formed on the first wafer surface 241 between the first annular retaining wall 201 and the second annular retaining wall 202. In addition, the third annular retaining wall 203 and the fourth annular retaining wall 204 are separated from each other and a second metal layer 230 is formed on the second wafer surface 242 between the third annular retaining wall 203 and the fourth annular retaining wall 204. As such, the first annular retaining wall structure 210 and the second annular retaining wall structure 211 may provide double-protection to prevent overflow of the alloy.

When a single-ring annular retaining wall structure is formed on the first wafer surface 241 and/or a single-ring annular retaining wall structure is formed on the second wafer surface 242, the alloy formed by bonding the first metal layer to the second metal layer may easily overflow. Therefore, as compared to annular retaining wall structures with a single ring, the disclosed annular retaining wall structures with double rings, i.e. the first annular retaining wall structure 210 and the second annular retaining wall structure 220, may demonstrate more efficient prevention of overflow.

The second annular retaining wall structure 211 may be made of one or more of $SiO_x$, $SiN_x$, SiON, etc. In one embodiment, the second annular retaining wall structure 211 is made of $SiO_x$.

Along the direction perpendicular to the second wafer surface 242, the thickness of the second annular retaining wall structure 211 may not be too large or too small. Detailed description of the requirements of the thickness of the second annular retaining wall structure 211 may be referred to the corresponding discussion on the thickness of the first annular retaining wall structure 210. In one embodiment, along the direction perpendicular to the first wafer surface 241, the thickness of the first annular retaining wall structure 210 may be in a range of approximately 0.6 μm to 2.5 μm.

Moreover, the profile of the second annular retaining wall structure 211 may also affect the ability of the second annular retaining wall structure 211 in preventing overflow of the alloy. In one embodiment, prior to bonding the wafers, each sidewall of the second annular retaining wall structure 211 may have a moderate slope. That is, along the direction perpendicular to the second wafer surface 242 and from the second wafer to the second annular retaining wall structure 211, the width of the second annular retaining wall structure 211 in a direction parallel to the second wafer surface 242 may gradually decrease.

Because in a subsequent process, the first annular retaining wall structure 210 and the second retaining wall structure 211 with moderate-slope sidewalls may contact each other more easily, the first annular retaining wall structure 210 and the second retaining wall structure 211 may have desired ability to prevent overflow of the alloy. In other embodiments, prior to bonding wafers, the sidewalls of the formed second annular retaining wall structure may be perpendicular to the second wafer surface. That is, along the direction perpendicular to the second wafer surface and from the second wafer to the second annular retaining wall structure, the width of the second annular retaining wall structure in the direction parallel to the second wafer surface may remain unchanged.

In one embodiment, after forming the third annular retaining wall 203 and the fourth annular retaining wall 204, the formation method may also include removing the third photoresist layer 271 and the fourth photoresist layer 272.

Figure 18:
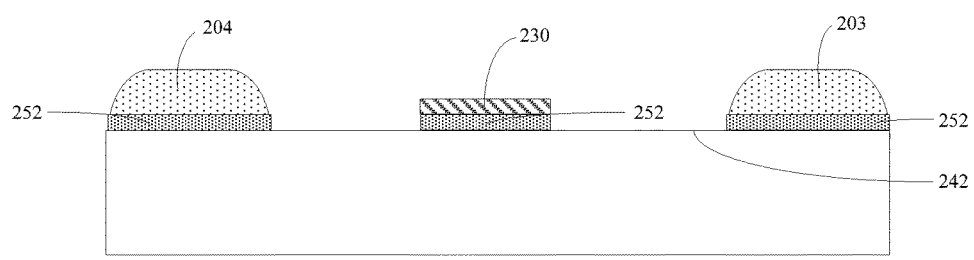

Further, returning to FIG. 24, after forming the second annular retaining wall structure, the portion of the second dielectric layer exposed by the second metal layer may be removed (S411). FIG. 18 shows a schematic partial cross-section view of a semiconductor structure consistent with various embodiments of the present disclosure.

Referring to FIG. 18, after forming the second annular retaining wall structure 211, the portion of the second dielectric layer 252 exposed by the second metal layer 230 may be removed.

In other embodiments, after forming the second annular retaining wall structure, the portion of the second dielectric layer exposed by the second metal layer may be retained.

Figure 19:
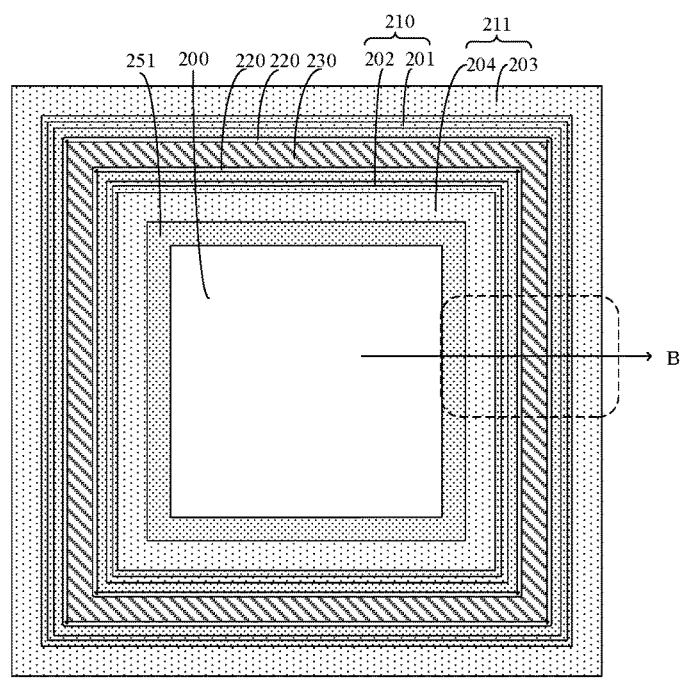
Figure 20:
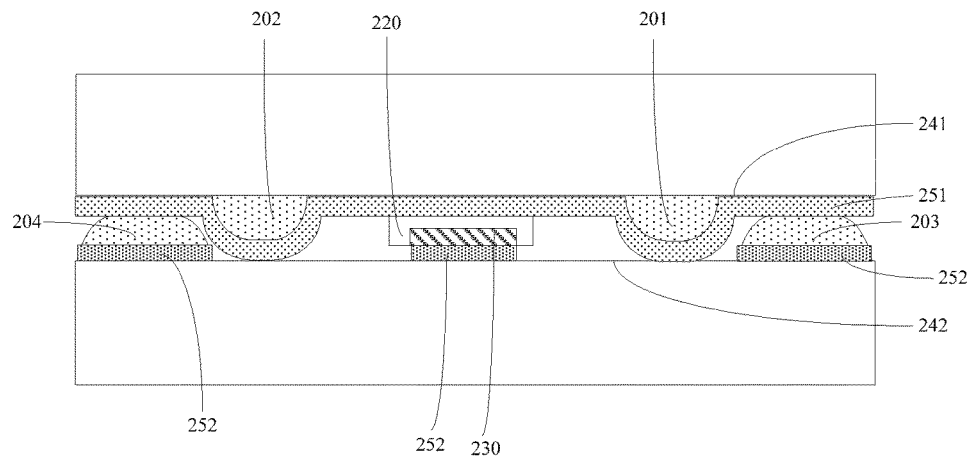

Further, returning to FIG. 24, the first metal layer and the second metal layer may be bonded together (S412). FIGS. 19-20 show schematic views of a semiconductor structure consistent with various embodiments of the present disclosure. Specifically, FIG. 19 shows a schematic perspective top view of the semiconductor structure and FIG. 20 shows a schematic partial cross-section local of the structure shown in FIG. 19 along a B direction.

Referring to FIGS. 19-20, the first metal layer 220 may be bonded to the second metal layer 230. Because the first annular retaining wall structure 210 and the second annular retaining wall structure 211 have desired ability to prevent overflow, the risk of overflow of the alloy formed in the process for bonding the first metal layer 220 and the second metal layer 230 may be reduced such that the wafer-bonding result may be improved.

In one embodiment, during the process for bonding the first metal layer 220 to the second metal layer 230, the top surface of the first annular retaining wall structure 210 may become to contact the second wafer surface 242, and the top surface of the second annular retaining wall structure 211 may become to contact the first wafer surface 241. As such, a closed overflow trench may be formed between the first annular retaining wall structure 210 and the second wafer surface 242, and also between the second annular retaining wall structure 211 and the first wafer surface 241. Therefore, the risk of overflow of the alloy may be reduced, and the wafer-bonding result may be improved. In other embodiments, the top surface of the first annular retaining wall structure may become to contact the second wafer surface, but the top surface of the second annular retaining wall structure may not contact the first wafer surface, or the top surface of the second annular retaining wall structure may become to contact the first wafer surface, but the top surface of the first annular retaining wall structure may not contact the second wafer surface.

Further, during the process for bonding the first metal layer 220 and the second metal layer 230, the first annular retaining wall structure 210 may correspond to a region between the third annular retaining wall 203 and the fourth annular retaining wall 204 of the second annular retaining wall structure 211. Alternatively, the second annular retaining wall structure 211 may correspond to a region surrounded by the first annular retaining wall structure 210. Therefore, the first annular retaining wall structure 210 and the second annular retaining wall structure 211 may be able to the determination of the relative position during the process for aligning the first wafer and the second wafer. As such, during the bonding process, shift in the relative position between the first metal layer 220 and the second metal layer 230 may be avoided, and further, the alignment accuracy for bonding the first metal layer 220 and the second metal layer 230 may be improved.

According to the disclosed wafer bonding methods, because the first annular retaining wall structure 210 and the second annular retaining wall structure 211 are able to help the determination of the relative position during the process for aligning the first wafer and the second wafer, the problem to have a relatively large shift between the first metal layer 220 and the second metal layer 230 during the bonding process may be resolved. Therefore, while the first metal layer 220 covering the second metal layer 230 after the bonding process is ensured, the width of the first metal layer 220 may be reduced. That is, along the direction parallel to the first wafer surface 241, even the width difference between the first metal layer 220 and the second metal layer 230 is reduced, precise alignment between the first metal layer 220 and the second metal layer 230 may still be achieved.

Compared to single-ring annular retaining wall structures, the disclosed double-ring annular retaining wall structure may improve the alignment accuracy for bonding the first metal layer 220 and the second metal layer 230. In addition, the extra width required for the first metal layer 220 to cover the second metal layer 230 may be reduced.

Figure 21:
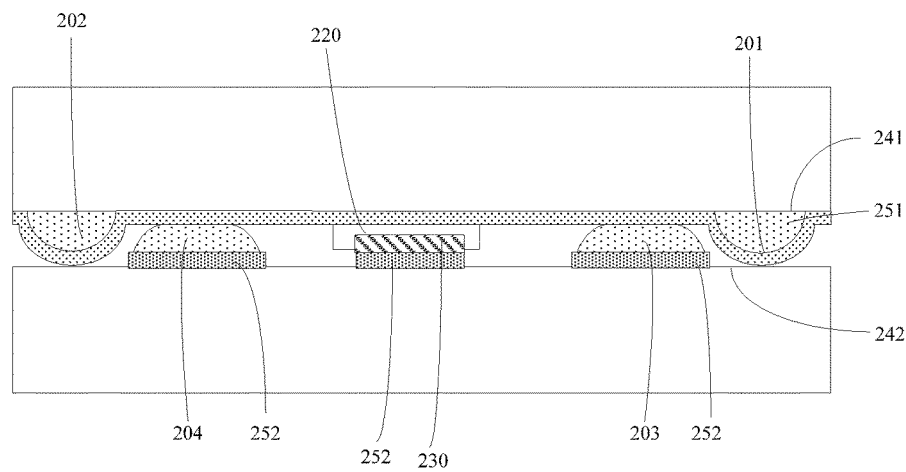
FIG. 21 illustrates a schematic cross-section view of an exemplary wafer-bonded structure consistent with various embodiments of the present disclosure.

In one embodiment, as shown in FIGS. 19-20, the first annular retaining wall structure 210 may be located in the region between the third annular retaining wall 203 and the fourth annular retaining wall 204 of the second annular retaining wall structure 211. In other embodiments, the second annular retaining wall structure may be located in the region between the first annular retaining wall and the second annular retaining wall of the first annular retaining wall structure. FIG. 21 shows a schematic partial cross-section view of a corresponding structure. Referring to FIG. 21, the second annular retaining wall structure (including a third annular retaining wall 203 and a fourth annular retaining wall 204) is located in the region surrounded by the first annular retaining wall structure (including a first annular retaining wall 201 and a second annular retaining wall 202).

In one embodiment, after bonding the first metal layer 220 and the second metal layer 230 together, the first metal layer 220 covers the second metal layer 230. Therefore, during the bonding process, the entire top surface of the second metal layer 230 is pressed onto the top surface of the first metal layer 220 to achieve the bonding between the first metal layer 220 and the second metal layer 230. Moreover, along a direction parallel to the first wafer surface 241, the width of the first metal layer 220 is about 2 µm to 3 µm larger than the width of the second metal layer 230.

In some other embodiments, after bonding the first metal layer and the second metal layer together, the second metal layer may cover the first metal layer. Therefore, during the bonding process, the entire top surface of the first metal layer is pressed onto the top surface of the second metal layer to achieve the bonding between the first metal layer and the second metal layer. Further, along a direction parallel to the second wafer surface, the width of the second metal layer is about 2 µm to 3 µm larger than the width of the first metal layer. Moreover, in other embodiments, the width difference between the first metal layer and the second metal layer may be smaller than 2 µm. For example, the width of the first metal layer may be 1 µm larger than the width or the second metal layer, the width of the first metal layer may be 1 µm smaller than the width or the second metal layer, or the width of the first metal layer may be equal to the width or the second metal layer.

In one embodiment, the first metal layer 220 and the second metal layer 230 may be bonded together through a eutectic bonding process. The parameters used in the eutectic bonding process may include a process temperature in a range of approximately 200° C. to 600° C., a process time in a range of approximately 3 minutes to 30 minutes, and a bonding force in a range of approximately 20 kN to 60 kN.

Further, the present disclosure also provides a wafer-bonded structure. FIGS. 19-20 show schematic views of a wafer-bonded structure consistent with the present disclosure. Specifically, FIG. 19 shows a schematic perspective top view of the wafer-bonded structure and FIG. 20 shows a schematic partial cross-section view of the wafer-bonded structure shown in FIG. 19 along the B direction.

Referring to FIGS. 19-20, the wafer-bonded structure may include a first wafer having a first wafer surface 241 and a second wafer having a second wafer surface 242. The wafer-bonded structure may further include a first metal layer 220 formed on a portion of the first wafer surface 241, a first annular retaining wall structure 210 formed on the first wafer surface 241, a second metal layer 230 formed on a portion of the second wafer surface 242, and a second annular retaining wall structure 211 formed on the second wafer surface 242.

The first annular retaining wall structure 210 may include a first annular retaining wall 201 and a second annular retaining wall 202. The first annular retaining wall 201 and the second annular retaining wall 202 may be separated from each other, and the second annular retaining wall 202 may be formed on the portion of the first wafer surface 241 surrounded by the first annular retaining wall 201. Moreover, the first metal layer 220 may be formed on the portion of the first wafer surface 241 between the first annular retaining wall 201 and the second annular retaining wall 202.

The second annular retaining wall structure 211 may include a third annular retaining wall 203 and a fourth annular retaining wall 204. The third annular retaining wall 203 and the fourth annular retaining wall 204 may be separated from each other, and the fourth annular retaining wall 204 may be formed on the portion of the second wafer surface 242 surrounded by the third annular retaining wall 203. Moreover, the second metal layer 230 may be formed on the portion of the second wafer surface 242 between the third annular retaining wall 203 and the fourth annular retaining wall 204.

Further, in the wafer-bonded structure, the first metal layer 220 and the second metal layer 230 may be bonded together, and the first metal layer 220 may cover the second metal layer 230.

In one embodiment, the first annular retaining wall structure 210 and the second annular retaining wall structure 211 may provide double-prevention to avoid overflow.

Each of the first annular retaining wall structure 210 and the second annular retaining wall structure 211 may be made of one or more of $SiO_x$, $SiN_x$, $SiON$, etc. In one embodiment, the first annular retaining wall structure 210 and the second annular retaining wall structure 211 are both made of $SiO_x$.

In one embodiment, along a direction perpendicular to the first wafer surface 241, the thickness of the first annular retaining wall structure 210 may be in a range of approximately 0.6 µm to 2.5 µm, and along a direction perpendicular to the second wafer surface 242, the thickness of the second annular retaining wall structure 211 may be in a range of approximately 0.6 µm to 2.5 µm.

In one embodiment, along a direction perpendicular to the first wafer surface 241 and from the first wafer to the first annular retaining wall structure 210, the width of the first annular retaining wall structure 210 in a direction parallel to the first wafer surface 241 may gradually decrease. That is, the width of the first annular retaining wall 201 and the width of the second annular retaining wall 202 in the direction parallel to the first wafer surface 241 may gradually decrease along the direction perpendicular to the first wafer surface 241 and from the first wafer to the first annular retaining wall structure 210. In addition, along a direction perpendicular to the second wafer surface 242 and from the second wafer to the second annular retaining wall structure 211, the width of the second annular retaining wall structure 211 along a direction parallel to the second wafer surface 242 may gradually decrease. That is, the width of the third annular retaining wall 203 and the width of the fourth annular retaining wall 204 in the direction parallel to the second wafer surface 242 may gradually decrease along the direction perpendicular to the second wafer surface 242 and from the second wafer to the second annular retaining wall structure 211.

In other embodiments, along the direction perpendicular to the first wafer surface 241 and from the first wafer to the first annular retaining wall structure 210, the width of the first annular retaining wall structure 210 in the direction parallel to the first wafer surface 241 may remain unchanged. Moreover, along the direction perpendicular to the second wafer surface 242 and from the second wafer to the second annular retaining wall structure 211, the width of the second annular retaining wall structure 211 in the direction parallel to the second wafer surface 242 may remain unchanged.

The first metal layer 220 may be made of a material that can form eutectic bonding with the subsequently-formed second metal layer. For example, the first metal layer 220 may be made of one or more of Al, Au, Cu, and Ge. In one embodiment, the first metal layer 220 is made of Ge.

The second metal layer 230 may be made of a material that can form eutectic bonding with the first metal layer 220. For example, the second metal layer 230 may be made of one or more of Al, Au, Cu, and Ge. In one embodiment, the second metal layer 230 is made of Al.

In one embodiment, along a direction parallel to the first wafer surface 241, the width of the first metal layer 220 is in a range of approximately 20 μm to 120 μm. In addition, along a direction parallel to the second wafer surface 242, the width of the second metal layer 230 is in a range of approximately 20 μm to 120 μm.

In one embodiment, the top surface of the first annular retaining wall structure 210 may be in contact with the second wafer surface 242, and the top surface of the second annular retaining wall structure 211 may be in contact with the first wafer surface 241. As such, a closed overflow trench may be formed between the first annular retaining wall structure 210 and the second wafer surface 242, and also between the second annular retaining wall structure 211 and the first wafer surface 241. Therefore, the risk of overflow of the alloy may be reduced, and the wafer-bonding result may be improved. In other embodiments, the top surface of the first annular retaining wall structure may be in contact with the second wafer surface but the top surface of the second annular retaining wall structure may not be in contact with the first wafer surface, or the top surface of the second annular retaining wall structure may be in contact with the first wafer surface but the top surface of the first annular retaining wall structure may not be in contact with the second wafer surface.

Moreover, the first annular retaining wall structure 210 and the second annular retaining wall structure 211 may help the determination of the relative position during the process for aligning the first wafer and the second wafer. As such, the alignment accuracy for bonding the first metal layer 220 and the second metal layer 230 may be improved.

In one embodiment, the first annular retaining wall structure 210 is located in a region between the third annular retaining wall 203 and the fourth annular retaining wall 204 of the second annular retaining wall structure 211. In other embodiments, the second annular retaining wall structure may be located in a region between the first annular retaining wall and the second annular retaining wall of the first annular retaining wall structure. FIG. 21 shows a schematic partial cross-section view of a corresponding wafer-bonded structure. Referring to FIG. 21, the second annular retaining wall structure including a third annular retaining wall 203 and a fourth annular retaining wall 204 may correspond to a region between a first annular retaining wall 201 and a second annular retaining wall 202 of the first annular retaining wall structure.

Figure 22:
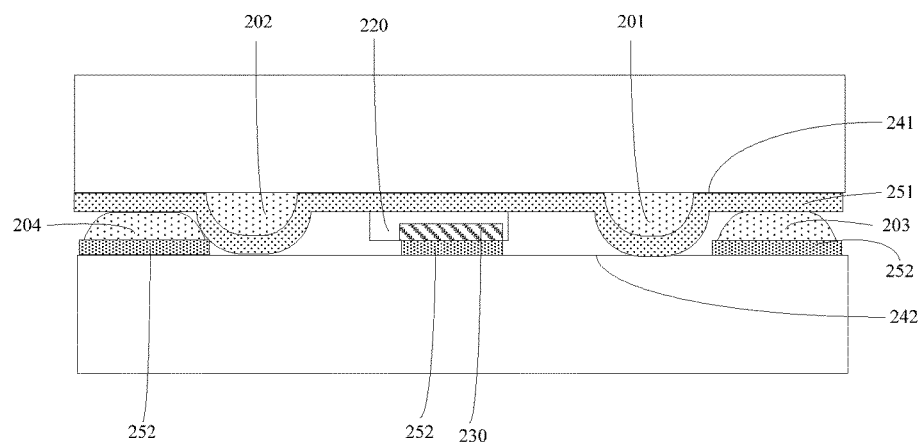
FIG. 22 illustrates a schematic cross-section view of another exemplary wafer-bonded structure consistent with various embodiments of the present disclosure.
Figure 23:
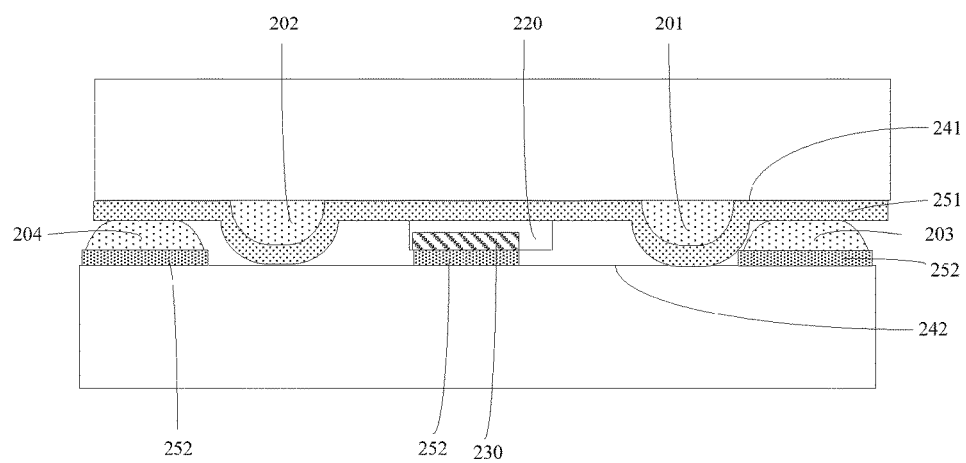
FIG. 23 illustrates a schematic cross-section view of another exemplary wafer-bonded structure consistent with various embodiments of the present disclosure.

In one embodiment, along a direction parallel to the first wafer surface 241, the first metal layer 220 covers the entire top surface of the second metal layer 230. That is, the width of the first metal layer 220 is larger than the width of the second metal layer 230, and the entire top surface of the second metal layer 230 is pressed onto the top surface of the first metal layer 220 to achieve the bonding between the first metal layer 220 and the second metal layer 230. For example, FIG. 20, FIG. 22, and FIG. 23 show schematic partial cross-section views of wafer-bonded structures with the first metal layer covering the entire second metal layer. Referring to FIG. 20, along the direction parallel to the first wafer surface 241, the first metal layer 220 covers the second metal layer 230 and the center of the first metal layer 220 is aligned with the center of the second metal layer 230. Referring to FIGS. 22-23, in each wafer-bonded structure, the first metal layer 220 covers the second metal layer, but the center of the first metal layer 220 and the center of the second metal layer 230 show an offset along the direction parallel to the first wafer surface 241. In some other embodiments, along a direction parallel to the second wafer surface, the second metal layer covers the entire top surface of the first metal layer, and the width of the second metal layer is greater than the width of the first metal layer. Alternatively, in other embodiments, the width of the first metal layer may be equal to the width of the second metal layer.

Compared to existing wafer-bonded structures and wafer bonding methods, the disclosed wafer-bonded structures and wafer bonding methods may demonstrate several advantages.

According to the disclosed wafer-bonded structures and wafer bonding methods, a first annular retaining wall structure is formed on the first wafer surface and a second annular retaining wall structure is formed on the second wafer surface such that desired prevention may be provided to avoid overflow of the alloy during the process for bonding the first metal layer and the second metal layer. Specifically, the first annular retaining wall structure includes two separated retaining walls, i.e. a first annular retaining wall and a second annular retaining wall. The first metal layer is formed on the portion of the first wafer surface between the first annular retaining wall and the second annular retaining wall. In addition, the second annular retaining wall structure also includes two separated retaining walls, i.e. a third annular retaining wall and a fourth annular retaining wall. The second metal layer is formed on the portion of the second wafer surface between the third annular retaining wall and the fourth annular retaining wall. As such, the first annular retaining wall structure and the second annular retaining wall structure may provide double-prevention to avoid overflow. Thus, the wafer-bonding result may be improved. In the meantime, the first annular retaining wall structure and the second annular retaining wall structure are able to the determination of the relative position during the process for aligning the first wafer and the second wafer. As such, the alignment accuracy for bonding the first metal layer and the second metal layer may be improved.

Optionally, the top surface of the first annular retaining wall structure is in contact with the second wafer surface, and the top surface of the second annular retaining wall structure is in contact with the first wafer surface. As such, a closed overflow trench may be formed between the first annular retaining wall structure and the second wafer surface, and also between the second annular retaining wall structure and the first wafer surface. Therefore, during the process for bonding the first metal layer and the second metal layer, the risk of overflow of the alloy may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A wafer bonding method, comprising:
   providing a first wafer including a first wafer surface;
   forming a first metal layer on a portion of the first wafer surface;
   forming a first annular retaining wall structure including a first annular retaining wall and a second annular retaining wall on the first wafer surface, wherein the first annular retaining wall and the second annular retaining wall are separated from each other, the second annular retaining wall is formed on the first wafer surface surrounded by the first annular retaining wall, and the first metal layer is formed on the first wafer surface between the first annular retaining wall and the second annular retaining wall;
   providing a second wafer including a second wafer surface;
   forming a second dielectric layer on the second wafer surface;
   forming a second metal layer on a portion of the second dielectric layer;
   forming a second annular retaining wall structure including a third annular retaining wall and a fourth annular retaining wall on the second wafer surface, wherein the third annular retaining wall and the fourth annular retaining wall are separated from each other, the fourth annular retaining wall is formed on the second wafer surface surrounded by the third annular retaining wall, and the second metal layer is formed on the second wafer surface between the third annular retaining wall and the fourth annular retaining wall, wherein the first annular retaining wall structure is protruding from the first wafer surface and located between the third annular retaining wall and the fourth annular retaining wall; and
   bonding the first metal layer and the second metal layer together.

2. The wafer bonding method according to claim 1, wherein:
   prior to bonding the first metal layer and the second metal layer together, a width of the first annular retaining wall structure in a direction parallel to the first wafer surface gradually decreases along a direction perpendicular to the first wafer surface and from the first wafer to the first annular retaining wall structure; and
   prior to bonding the first metal layer and the second metal layer together, a width of the second annular retaining wall structure in a direction parallel to the second wafer surface gradually decreases along a direction perpendicular to the second wafer surface and from the second wafer to the second annular retaining wall structure.

3. The wafer bonding method according to claim 1, wherein an order to form the first metal layer and the first annular retaining wall structure includes one of:
   forming the first annular retaining wall structure before forming the first metal layer; and
   forming the first annular retaining wall structure after forming the first metal layer.

4. The wafer bonding method according to claim 1, wherein:
   the first metal layer is made of one of germanium and aluminum;
   the second metal layer is made of one of germanium and aluminum;
   the first annular retaining wall structure is made of at least one of $SiO_x$, $SiN_x$, and SiON; and
   the second annular retaining wall structure is made of at least one of $SiO_x$, $SiN_x$, and SiON.

5. The wafer bonding method according to claim 1, wherein forming the first annular retaining wall structure includes:
   forming a first barrier layer on the first wafer surface;
   forming a first annular photoresist layer on a portion of the first barrier layer and a second annular photoresist layer on the first barrier layer surrounded by the first annular photoresist layer, wherein the first annular photoresist layer and the second annular photoresist layer are separated from each other;
   forming the first annular retaining wall by etching the first barrier layer using the first annular photoresist layer as an etch mask;
   forming the second annular retaining wall by etching the first barrier layer using the second annular photoresist layer as an etch mask; and
   removing the first annular photoresist layer and the second annular photoresist layer.

6. The wafer bonding method according to claim 5, after forming the first annular photoresist layer and the second annular photoresist layer and prior to forming the first annular retaining wall and the second annular retaining wall, further including:
   performing a first reflux process on the first annular photoresist layer and the second annular photoresist layer, wherein process parameters used in the first reflux process include a process temperature in a range of approximately 150° C. to 200° C., and a process time in a range of approximately 2 minutes to 10 minutes.

7. The wafer bonding method according to claim 1, wherein, when bonding the first metal layer and the second metal layer together,
   a top surface of the first annular retaining wall structure is in contact with the second wafer surface; and
   a top surface of the second annular retaining wall structure is in contact with the first wafer surface.

8. The wafer bonding method according to claim 1, wherein:
   the second annular retaining wall structure is formed after forming the second metal layer; and
   forming the second annular retaining wall structure includes:

forming a second barrier layer on the second metal layer and the second dielectric layer;

forming a third annular photoresist layer on a portion of the second barrier layer and a fourth annular photoresist layer on the second barrier layer surrounded by the third annular photoresist layer, wherein the third annular photoresist layer and the fourth annular photoresist layer are separated from each other;

forming the third annular retaining wall by etching the second barrier layer using the third annular photoresist layer as an etch mask;

forming the fourth annular retaining wall by etching the second barrier layer using the fourth annular photoresist layer as an etch mask; and removing the third annular photoresist layer and the fourth annular photoresist layer.

9. The wafer bonding method according to claim 8, after forming the third annular photoresist layer and the fourth annular photoresist layer and prior to forming the third annular retaining wall and the fourth annular retaining wall, further including:

performing a second reflux process on the third annular photoresist layer and the fourth annular photoresist layer, wherein process parameters used in the second reflux process include a process temperature in a range of approximately 150° C. to 200° C., and a process time in a range of approximately 2 minutes to 10 minutes.

10. The wafer bonding method according to claim 1, wherein:

the first wafer includes a first device region surrounded by the second annular retaining wall, wherein a plurality of first devices are formed on the first wafer in the first device region.

11. The wafer bonding method according to claim 1, wherein:

the second wafer includes a second device region surrounded by the fourth annular retaining wall, wherein a plurality of second devices are formed on the second wafer in the second device region.

12. A wafer bonding method, comprising:

providing a first wafer including a first wafer surface;

forming a first dielectric layer on the first wafer surface;

forming a first metal layer on a portion of the first dielectric layer;

forming a first annular retaining wall structure including a first annular retaining wall and a second annular retaining wall on the first wafer surface, wherein the first annular retaining wall and the second annular retaining wall are separated from each other, the second annular retaining wall is formed on the first wafer surface surrounded by the first annular retaining wall, and the first metal layer is formed on the first wafer surface between the first annular retaining wall and the second annular retaining wall;

providing a second wafer including a second wafer surface;

forming a second metal layer on a portion of the second wafer surface;

forming a second annular retaining wall structure including a third annular retaining wall and a fourth annular retaining wall on the second wafer surface, wherein the third annular retaining wall and the fourth annular retaining wall are separated from each other, the fourth annular retaining wall is formed on the second wafer surface surrounded by the third annular retaining wall, and the second metal layer is formed on the second wafer surface between the third annular retaining wall and the fourth annular retaining wall; and bonding the first metal layer and the second metal layer together.

13. The wafer bonding method according to claim 12, wherein:

the first annular retaining wall structure is formed before forming the first metal layer; and forming the first dielectric layer and the first metal layer includes:

forming the first dielectric layer on the first wafer surface and the first annular retaining wall structure;

forming a first metal film on the first dielectric layer; and patterning the first metal film to form the first metal layer.

14. A wafer-bonded structure, comprising:

a first wafer including a first wafer surface;

a first metal layer formed on a portion of the first wafer surface;

a first annular retaining wall structure formed on the first wafer surface and including a first annular retaining wall and a second annular retaining wall, wherein the first annular retaining wall and the second annular retaining wall are separated from each other, the second annular retaining wall is formed on the first wafer surface surrounded by the first annular retaining wall, and the first metal layer is formed on the first wafer surface between the first annular retaining wall and the second annular retaining wall;

a second wafer including a second wafer surface;

a second metal layer formed on a portion of the second wafer surface; and a second annular retaining wall structure formed on the second wafer surface and including a third annular retaining wall and a fourth annular retaining wall, wherein:

the third annular retaining wall and the fourth annular retaining wall are separated from each other, the fourth annular retaining wall is formed on the second wafer surface surrounded by the third annular retaining wall, the second metal layer is formed on the second wafer surface between the third annular retaining wall and the fourth annular retaining wall, and the first metal layer and the second metal layer are bonded together, and the first annular retaining wall structure is protruding from the first wafer surface and located between the third annular retaining wall and the fourth annular retaining wall, wherein:

a top surface of the first annular retaining wall structure is in contact with the second wafer surface; and a top surface of the second annular retaining wall structure is in contact with the first wafer surface.

15. The wafer-bonded structure according to claim 14, wherein:

a width of the first annular retaining wall structure in a direction parallel to the first wafer surface gradually decreases along a direction perpendicular to the first wafer surface and from the first wafer to the first annular retaining wall structure; and a width of the second annular retaining wall structure in a direction parallel to the second wafer surface gradually decreases along a direction perpendicular to the second wafer surface and from the second wafer to the second annular retaining wall structure.

16. The wafer-bonded structure according to claim 14, wherein:
   along a direction parallel to the first wafer surface, the first metal layer covers the second metal layer; or
   along a direction parallel to the second wafer surface, the second metal layer covers the first metal layer.

17. The wafer-bonded structure according to claim 14, wherein:
   the first annular retaining wall structure is in a region surrounded by the second annular retaining wall structure; or
   the second annular retaining wall structure is in a region surrounded by the first annular retaining wall structure.

18. The wafer-bonded structure according to claim 14, wherein:
   the first metal layer is made of one of germanium and aluminum;
   the second metal layer is made of one of germanium and aluminum;
   the first annular retaining wall structure is made of at least one of $SiO_x$, $SiN_x$, and SiON; and
   the second annular retaining wall structure is made of at least one of $SiO_x$, $SiN_x$, and SiON.

\* \* \* \* \*